United States Patent [19]

Evans et al.

[11] Patent Number: 5,219,712

[45] Date of Patent: Jun. 15, 1993

[54] METHOD OF FORMING A SOLID ARTICLE

[75] Inventors: Stephen D. Evans; John E. A. Shaw, both of Middlesex; Alastair Sibbald; Peter D. Whalley, both of Berkshire, all of England

[73] Assignee: Thorn EMI plc, London, England

[21] Appl. No.: 782,731

[22] Filed: Oct. 28, 1991

Related U.S. Application Data

[63] Continuation of Ser. No. 279,552, Nov. 23, 1988, abandoned.

[30] Foreign Application Priority Data

Nov. 28, 1987 [GB] United Kingdom ............... 8727902

[51] Int. Cl.⁵ .............................................. G03C 5/00
[52] U.S. Cl. .................................... 430/311; 430/298; 430/315; 430/322; 430/324; 430/327
[58] Field of Search ............... 430/298, 311, 315, 322, 430/327, 324

[56] References Cited

U.S. PATENT DOCUMENTS 4,233,396  1/1980  Armstrong et al. ............... 430/322
4,828,967  5/1989  Mase et al. ........................ 430/311
4,978,604 12/1990  Banks et al. ...................... 430/327

FOREIGN PATENT DOCUMENTS 60-179240  9/1985  Japan .
61-120712A 6/1986  Japan .

Primary Examiner—Marion E. McCamish
Assistant Examiner—Kathleen Duda
Attorney, Agent, or Firm—Keck, Mahin & Cate

[57] ABSTRACT

In a method of forming a solid article of predetermined shape from a liquid which can be cured by exposure to radiation, a surface upon which the article is to be formed is provided. A predetermined region of the surface is exposed to a beam of radiation. Liquid is then supplied to an unexposed region of the surface such that a solid barrier, defining a surface of the solid article, is created at the interface of the liquid and the beam. The solid barrier is effective as a mold to contain the liquid which has been supplied but not yet cured until this liquid is cured. Such a method can be used to encapsulate a microelectronic device.

18 Claims, 9 Drawing Sheets

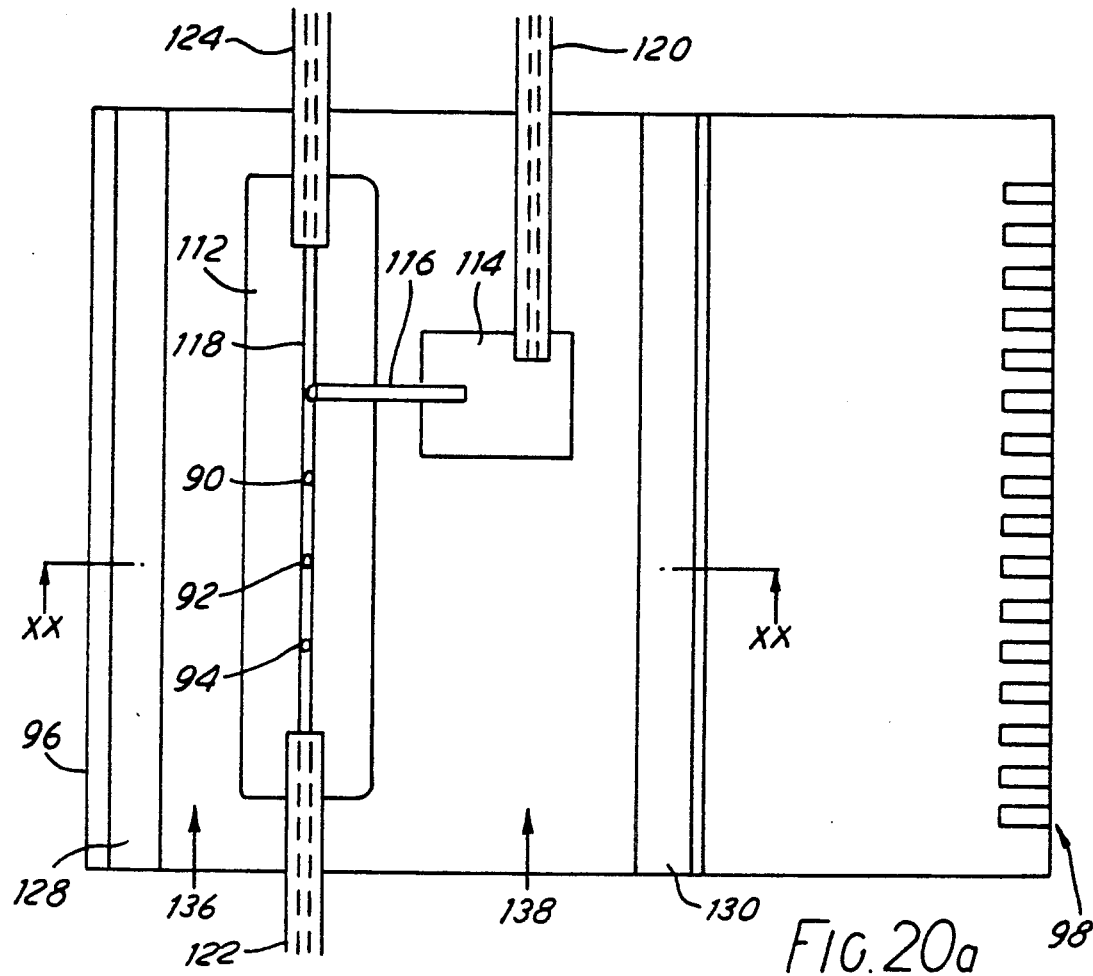
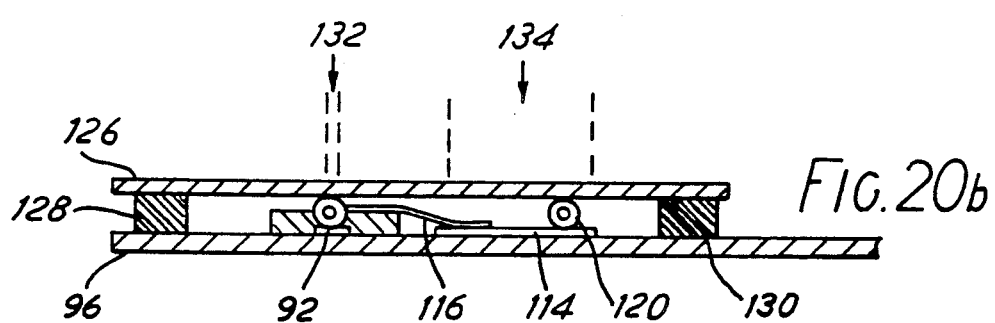
FIG. 20a
FIG. 20b

METHOD OF FORMING A SOLID ARTICLE

This application is a continuation of application Ser. No. 07/279,552, filed Nov. 23, 1988 now abandoned.

This invention relates to a method of forming a solid article from a liquid which can be cured by exposure to radiation. In particular, this invention relates to a method of encapsulating a microelectronic device and to an encapsulated device produced by that method.

It is known that there is a range of materials, e.g. UV curable epoxy adhesives, available as liquids which solidify on exposure to electromagnetic or particulate radiation of sufficient energy to produce cross-linkage, e.g. UV radiation. Solid articles may be defined in initially uncured materials using essentially conventional photolithographic techniques to apply radiation patterns to filled volumes or swamped surfaces, with the uncured material being subsequently drained or washed out.

JP 61-120712A for example discloses a method of moulding a three dimensional shape from liquid photosensitive resins which involves controlling the shift of an optical point source and its light intensity. The liquid photosensitive resin is placed in a tank and an optical point source, e.g. an end of an optical fibre, is shifted to a target point within the liquid resin. The shift of the optical point source is controlled along three axes crossing at right angles to each other and the intensity of light is also controlled. The photosensitive resin is cured according to the loci of the optical point source to produce a three-dimensional article.

Geometries realisable by such methods are limited by, amongst other factors, the requirement to be able to remove uncured material. Known photolithographic methods are also inadequate where it is desired to incorporate within the defined structure, a surface, eg of an electrical or optical component such as a sensor, which must not be allowed to come into contact with the liquid substance, e.g. epoxy or other polymer, and/or which cannot tolerate subsequent washing stages to remove uncured material.

One particular aspect of this problem relates to microelectronic devices such as ion sensitive field effect transistors (ISFETs) and related devices, e.g. micro (thin or thick film) coated wire type ion selective electrodes, amperometric sensors such as Clark cells and optical sensors. Such devices have regions responsive to particular external stimuli e.g. the presence of ions, ambient pressure, etc, which are exposed to an analyte, i.e. a media, such as a solution or gas, etc, to be analysed. However, it is necessary that bond wires and metallisations associated with the devices themselves are effectively isolated from the analyte and this is effected by encapsulation. The accurate and reproducible placement of encapsulant material in the relatively confined spacing on chips and over the fragile bond wires is difficult, especially if skilled and time consuming manual operations are to be excluded. Curable epoxy resins, sensitive to particulate radiation or electromagnetic radiation in the IR to gamma wavelength ranges have proved suitable for encapsulating such devices, in that they are resistant to leakage. However, a major problem with these materials has been that of preventing flow of the uncured material onto the responsive (i.e. sensing) region of the device, though some success has been achieved with the use of air jets and/or physical barriers produced using e.g. thick film photoresist, such as Vacrel or Riston, to protect the responsive region.

A related problem is that some proposed applications of e.g. an ISFET device require that an analyte solution be presented to the ISFET gate via a flow system. For the successful operation of the device, it is highly desirable that smooth channels, without dead volumes and the tendency to trap bubbles, lead to and from the ISFET device. It is also desirable that the assembly procedure be automatable. Manual procedures presently used for assembling such flow systems, in which a flow cap is bonded, e.g. by silicone rubber adhesive, to an encapsulated ISFET device, are complex, involving several stages and tend to produce irreproducible flow characteristics, significant dead volumes and bubble traps.

It is an object of the present invention to provide an improved method of forming solid articles of a variety of shapes, including articles made from liquid polymers which are cured by radiation and in which areas need to be maintained clear of uncured polymer during the formation of the article. It is a related object of the present invention to provide a method using liquid polymers for encapsulating and packaging microelectronic devices incorporating regions responsive to particular external stimuli, e.g. the presence of ions, ambient pressure etc, which must not be allowed to come into contact with the liquid polymer; such method being preferably automatable. It is also an object of the present invention to provide a package including an encapsulated microelectronic device with a smooth flow channel.

According to the present invention there is provided a method of forming a solid article of predetermined shape from a liquid which can be cured by exposure to radiation, the method comprising the steps of providing a surface upon which the article is to be formed, exposing a predetermined region of the surface to a beam of radiation; supplying the liquid to an unexposed region of the surface such that a solid barrier, defining a surface of the solid article, is created at the interface of the liquid and the beam and curing the liquid which has been supplied, but not yet cured, to form said solid article.

The radiation used may be electromagnetic radiation in the IR to gamma wavelength ranges, especially UV light, or particulate radiation. The liquid polymer is cured by cross-linkage.

It is an advantage of the present invention that an integral unit of complex shape may be formed which could not, in practice, be formed by hitherto known processes such as injection moulding, extrusion, or drilling except by assembly of separate discrete, premoulded units. It is also an advantage of the invention that said method may be automated. It is a further advantage that only the quantity of liquid polymer used to produce the final solid article is involved in the method, and that no draining or washing out stages with consequent wastage are required.

The method may also comprise the steps of moving and/or altering the shape of said beam of radiation relative to said surface on which the article is formed as liquid is being supplied and/or altering the position and/or inclination of the surface upon which the article is to be formed relative to said beam.

The liquid which has been supplied but not cured may be exposed to another beam of radiation to be cured while further liquid is being supplied to the unexposed region.

Other surfaces of the article may be defined by providing one or more sidewalls attached to the surface upon which the article is to be formed or by using more than one beam of radiation. Where the solid article is to include a solid component of a different material, said solid component being positioned within said exposed region of the surface upon which the article is to be formed, the different material may be transparent to the radiation used.

Where the liquid can be cured by exposure to radiation or to heat, the liquid which has been supplied but not yet cured may be cured by heating. Where the liquid can be cured by exposure to radiation of more than one wavelength, the liquid which has been supplied but not yet cured may be cured by exposure to a beam of more penetrating radiation.

Where the surface upon which the article is to be formed includes a region which is not to be touched by the liquid, the method may further comprise the step of defining the shape of said beam of radiation so that the borders of said region which is not to be touched by the liquid fall within said exposed region of the surface upon which the article is to be formed.

The surface upon which the article is to be formed may be a surface of a microelectronic device, the article to be formed thereon being an encapsulation of said device. A region which is not to be touched by the liquid may include a responsive region of the microelectronic device responsive to a particular external stimulus. Preferably said beam of radiation is so shaped that said responsive region of said device is not exposed to said beam.

The method may provide the walls of a flow channel suitable for exposing a responsive region of a microelectronic device responsive to a particular external stimulus to an analyte, wherein the region which is not to be touched by the liquid is the cavity of the flow channel. Preferably the microelectronic device is encapsulated as outlined hereinbefore. Preferably a top solid layer of material transparent to the radiation is provided above the microelectronic device so as to define the height of the flow channel.

The present invention also provides a package including a microelectronic device having a responsive region responsive to a particular external stimulus, an encapsulation layer around said responsive region and a flow channel suitable for exposing said responsive region to an analyte, characterised in that the walls of said flow channel are integral, and continuous with, said encapsulation layer.

Embodiments of the present invention will now be described by way of example and with reference to the accompanying drawings in which:

FIG. 10b is a sectional view along the line X—X of FIG. 10a.

FIG. 11b is a sectional view along the line XI—XI of FIG. 11a.

FIG. 12b is a sectional view along the line XII—XII of FIG. 12a.

FIG. 20a is a plan view showing a stage in the formation of a flow system incorporating the encapsulated devices of FIG. 19.

FIG. 20b is a sectional view along the line XX—XX in FIG. 20a.

Figure 1:
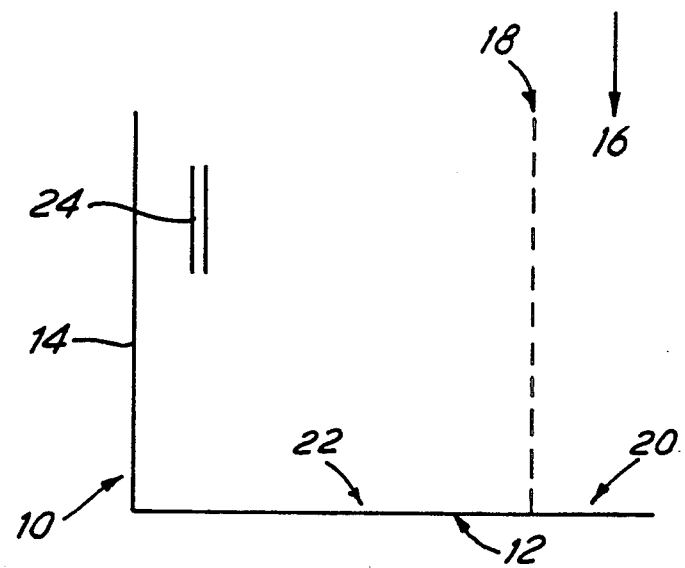
FIGS. 1 to 9 are sectional views of a container showing stages in the formation of a simple solid article and illustrating some of the basic principles of the method of the present invention.

FIG. 1 shows a container 10 in which a solid article is to be formed, the container having a base 12, which is horizontal, and a sidewall 14. A collimated beam of radiation 16, one edge of which is indicated by line 18, is directed onto a region 20 of the base 12. A second region 22 of the base is not exposed to the radiation and there is an inlet 24 within the unexposed region 22 for the liquid polymer 26 (not shown in FIG. 1) from which the solid article is to be formed. The frequency and intensity of the beam of radiation 16 is such that the liquid polymer 26 is cured rapidly upon exposure to radiation. In this example, the polymer is Norland Optical Adhesive 81, which is cured by ultra violet radiation in the wavelength range from 320 nm to 400 nm.

Figure 2:
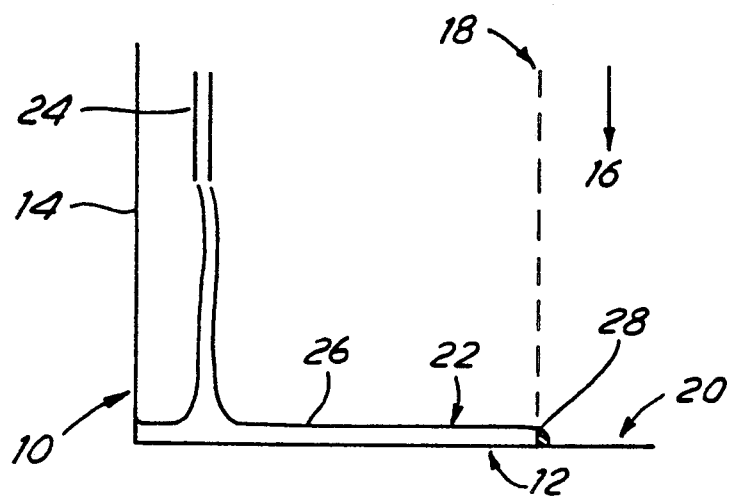

As shown in FIG. 2, when liquid polymer 26 is passed into the container 10 through the inlet 24, it flows onto the unexposed region 22 of the base 12. As the leading edge of the liquid polymer flow 26 passes the edge 18 of the beam of radiation, it is cured rapidly to form a barrier 28, of solid polymer which prevents further flow of the liquid polymer 26 into the exposed region 20 of the base 12. The barrier 28 defines a surface of the solid article to be formed.

Figure 3:
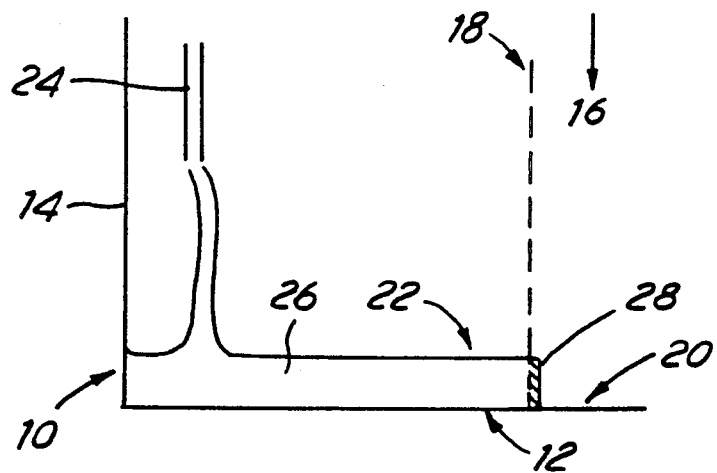

As more liquid polymer 26 is added as shown in FIG. 3, the height of the barrier 28 grows with the level of the liquid polymer 26 in the unexposed region 22. The exposed region 20, beyond the barrier 28, remains clear of liquid polymer 26. In effect, the edge 18 of the beam of radiation 16 acts as an optical mould to form a surface of the solid article.

Figure 4:
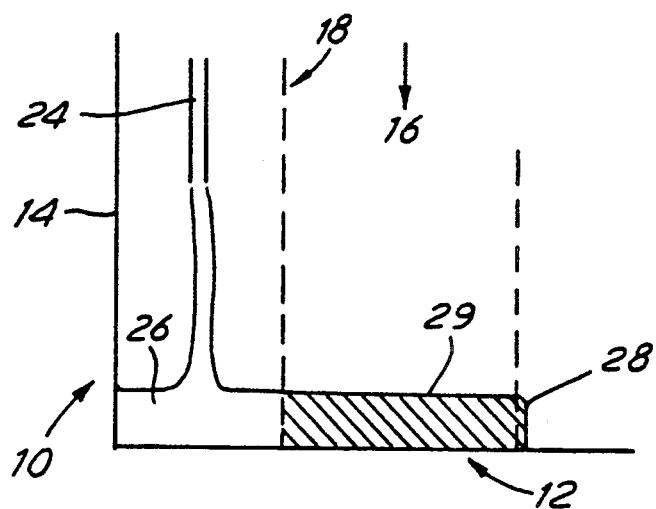
Figure 5:
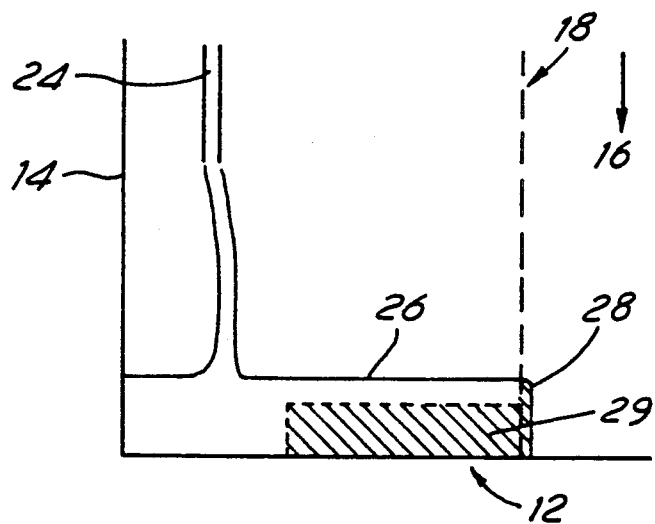

In FIG. 4, the edge 18 of the beam of radiation 16 has been moved into the previously unexposed region 22 of the container 10. This enables a wider section 29 of the liquid polymer 26 to be cured, strengthening the barrier 28 as the depth of liquid polymer 26 is increased. The edge 18 of the radiation may then be moved back to its previous position as shown in FIG. 5 to continue the formation of the surface of the solid article.

Figure 6:
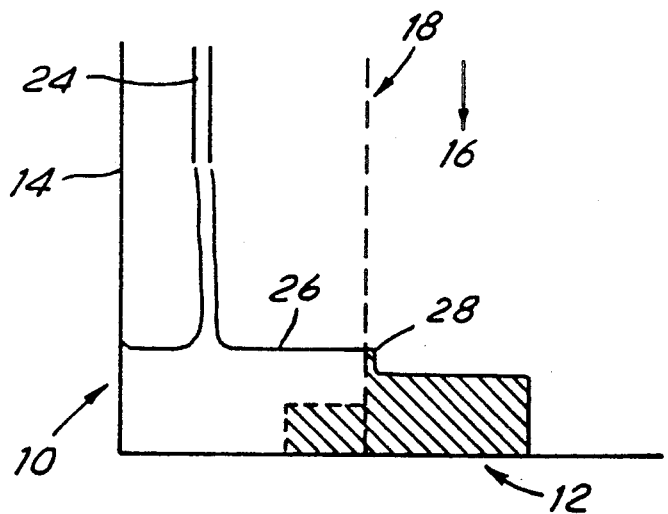
Figure 7:
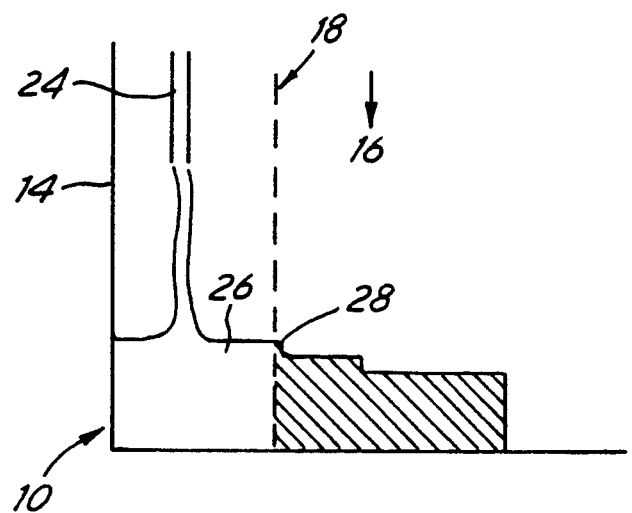
Figure 8:
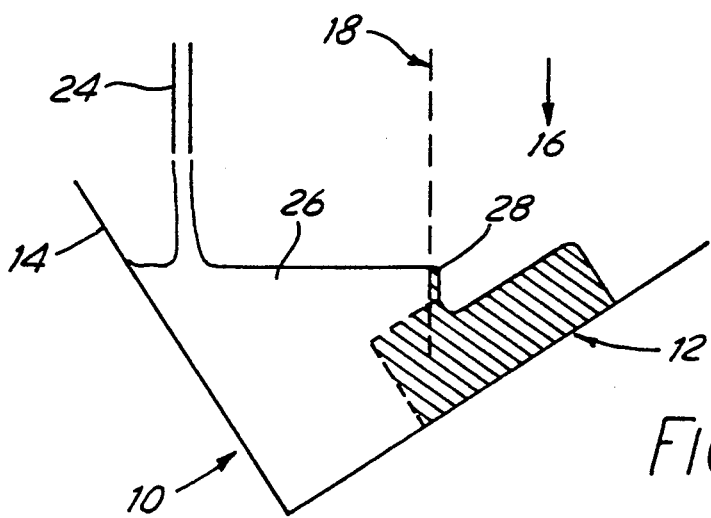
Figure 9:
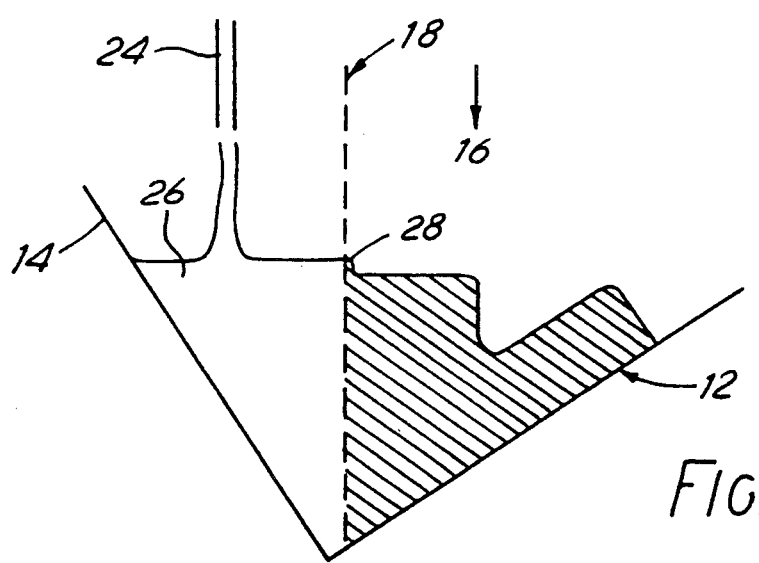

It is possible to change the position of the barrier 28 and hence the shape of the formed surface of the solid article by moving the edge 18 of the beam of radiation 16 relative to the base 12 as shown in FIGS. 6 and 7. The surface of the solid article is also defined by the direction of growth of the barrier 28, which direction may be changed by altering the alignment of the base 12 relative to the horizontal, as shown in FIGS. 8 and 9, or by changing the position and/or alignment of base 12 relative to the beam.

Figure 10A:
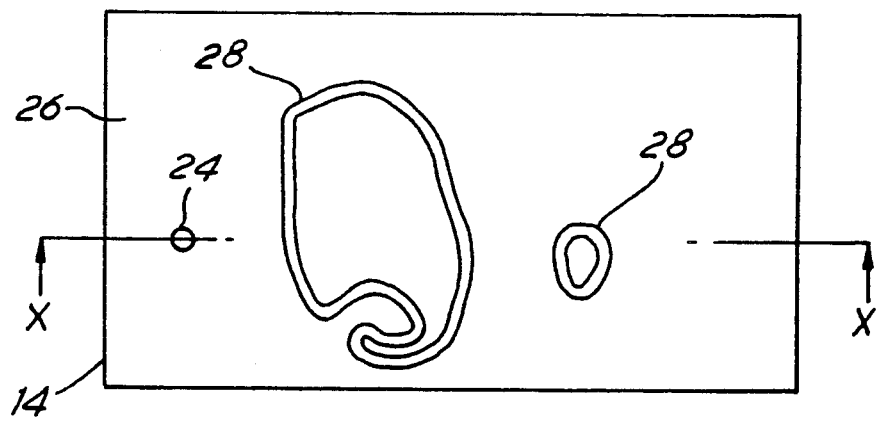
FIG. 10a is a plan view representing a stage in the formation of a more complex shaped solid article.
Figure 10B:
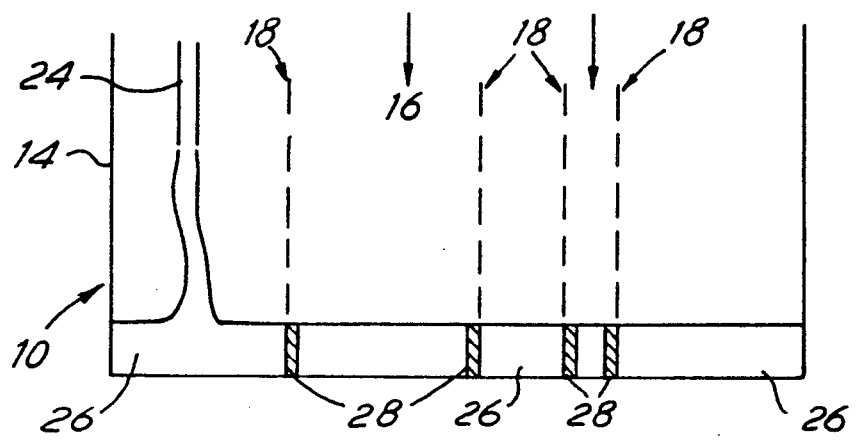

Barriers 28, and hence the shape of the solid article, may be further defined by modifying the shape and/or direction of the beam of radiation 16, eg by masking or altering the trajectory swept out by a moving laser. As shown in FIGS. 10a and 10b it is possible, by suitable masking and positioning of the inlet 24, to form separate barriers 28 simultaneously which may then, by alteration of the masking profile and inclination of the container, be so configured as to define an integral component. It is envisaged that it should be possible to form completely isolated chambers within the solid article, or chambers linked by passages together and/or to the outside of the solid article, by suitable manipulation of the container 10, including, for example, rotation of the container.

Figure 11A:
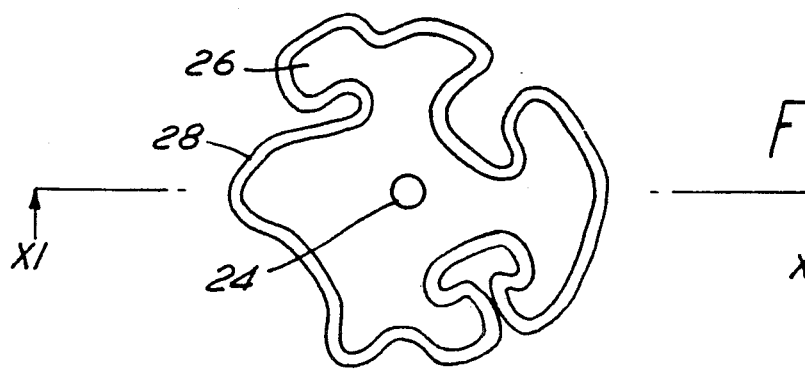
FIG. 11a is a plan view representing a stage in the formation of a solid article without a container.
Figure 11B:
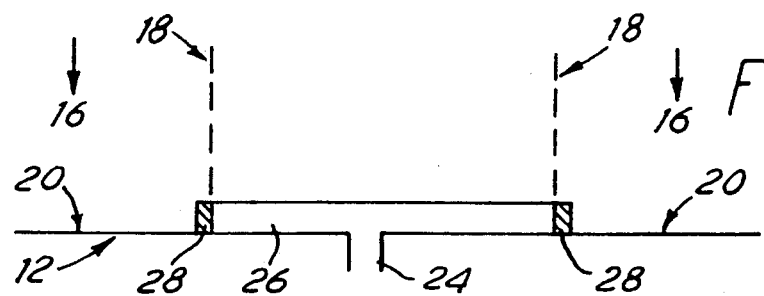

FIGS. 11a and 11b show a stage in the formation of a solid article whose shape is defined only by optical moulds, i.e. the edges 18 of beams of radiation 16, and a base 12. In principle, only the base 12 need be solid—the cross-sectional shape of the solid article may be defined by a combination of optical moulds and preformed barriers or by optical moulds alone.

As also shown in FIG. 11b, the inlet 24 for the liquid polymer 26 may be from below the base 12, so long as there remains a shielded path for liquid polymer flow while the shape of the solid article is being formed.

Figure 12A:
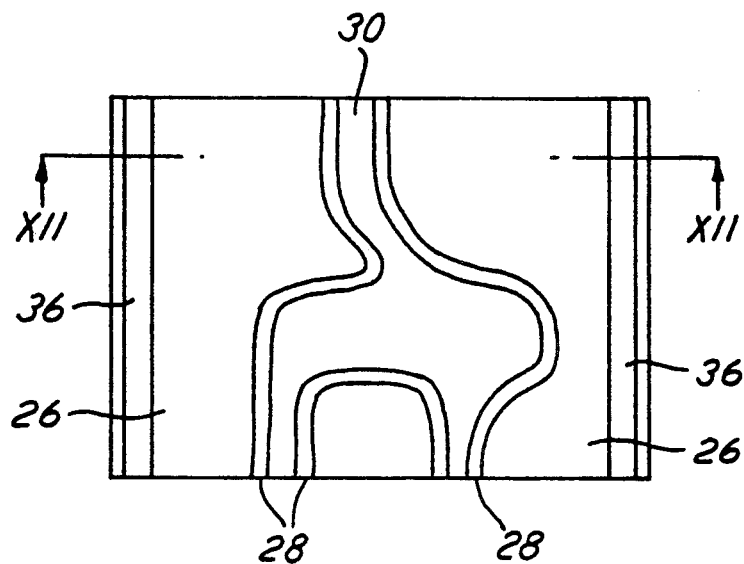
FIG. 12a is a plan view represent a stage in the formation of a channel on a substrate.
Figure 12B:
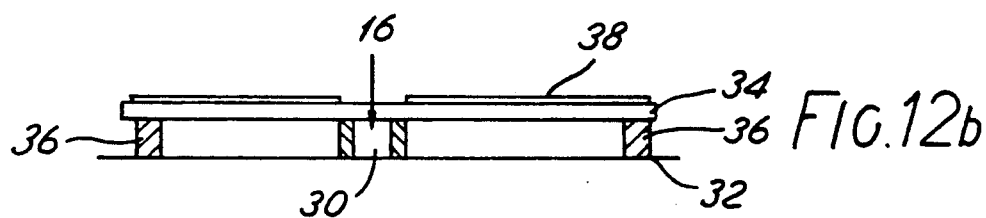

FIGS. 12a and 12b show a stage in the formation of a channel 30 between two plates 32 and 34, the separation of which is defined by spacers 36. The shape of the beam of radiation 16 and hence the shape of the channel 30 is given by a mask layer 38 (shown in the sectional view FIG. 12b but not in the plan view FIG. 12a). The top plate 34 is transparent to the radiation used.

Figure 13:
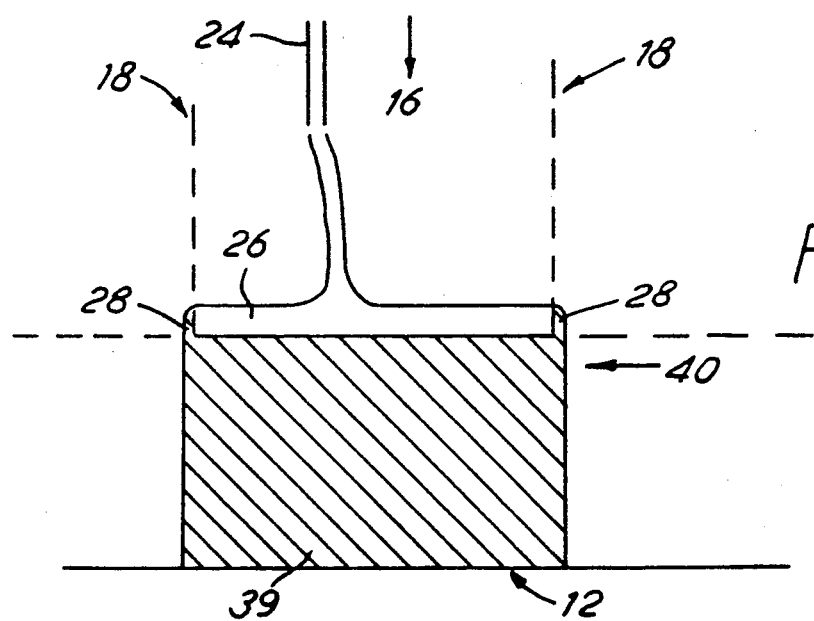
FIG. 13 is a sectional view representing a later stage in the formation of a solid article.

Once the shape of the solid article has been defined by the barriers 28, the whole structure can be flood illuminated by the radiation to harden the liquid polymer to form a solid structure. Alternatively, as shown in FIG. 13, it is possible to harden the supporting bulk 39, of the article as the barriers 28 are formed by the use of a horizontal beam 40. This beam 40 is moved upwards a little behind the level of the liquid polymer 26.

If a polymer system were chosen that could be hardened by heat as well as by the particulate or electromagnetic radiation used for the optical moulds, it would also be possible to harden the structure by heating the whole structure after the surface of the solid article had been defined. A polymer system could also be chosen that could be hardened by particulate or electromagnetic radiation of more than one wavelength. In such a case, it would be possible to define the surface of the solid article using a less penetrating radiation and harden the structure using a more penetrating radiation. Such alternatives would be particularly useful for relatively thick structures or if the structure were to incorporate a component of a different material which was less transparent to the radiation used for the optical moulds.

The shapes of articles formed by the use of one or more beams of radiation as optical moulds may be defined by varying the direction and extent of one or more beams of the radiation, the orientation of the workpiece on which the base is mounted and the flow of liquid polymer. Variation in radiation beam configuration may be achieved by using one or a combination of more than one of the following means: servo units to control laser or other radiation sources to vary the direction of a beam; servo units to control the orientation of, or to exchange, photomasks to vary the extent of a beam; electrically controlled masks incorporating shutters, LCD elements or other suitable electro-optic components to vary the extent of a beam; servo units to control orientation and movement of optical components such as lenses and mirrors to vary the extent of a beam. Variation in workpiece orientation may be achieved by servo unit operation of x, y, z and $\theta$ stages. Variation in liquid polymer flow may be achieved by using electrically controlled pumps. By interfacing the various servo units and electrically operated elements to a computer, variation in beam configuration, workpiece orientation and liquid polymer flow can be brought under software control. This accordingly allows a range of articles of different shapes to be produced largely under software control at a single optical moulding workstation.

Another advantage of the use of optical moulds, which can be simply switched off and on and moved, is in the formation of structures with surfaces which would key to solid moulds and hence not be accessible by injection moulding, pressing or extrusion or have recesses out of line of, sight from surface openings, and hence not be accessible by hithertoknown moulding or milling techniques.

An application of an optical mould of the kind described relates to the encapsulation of ISFETs and related devices.

Figure 14:
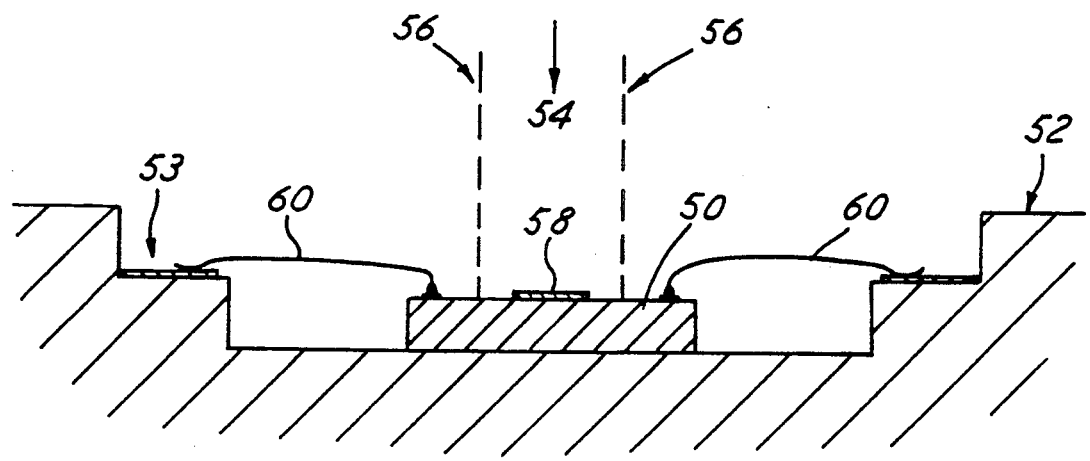
FIGS. 14 to 16 are sectional views showing stages in the encapsulation of a microelectronic device in accordance with the present invention.

FIG. 14 shows an ISFET chip 50 bonded onto a header 52 having a well type formation 53. The chip 50 is to be encapsulated using a UV curable epoxy such as Norland Optical Adhesive 81. A beam 54 of UV radiation is directed onto the chip 50 so that the outer edge 56 of the beam 54 lies a little outside the gate 58 of the chip 50, the gate 58 being a chemically responsive region which should be kept clear of epoxy, but not sufficiently far out to fall upon the areas which must be covered by epoxy i.e. wires 60, bond pads and metallised tracks (not shown).

Figure 15:
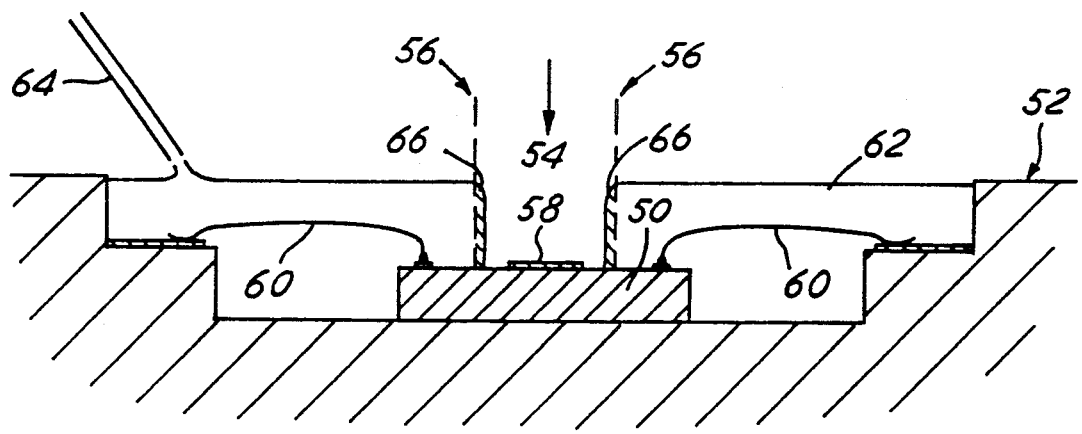
Figure 16:
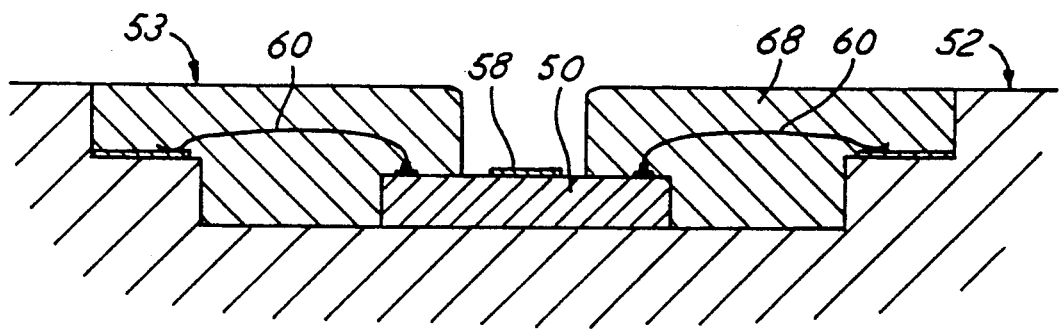

As shown in FIG. 15, the uncured epoxy 62 is added to the area around the chip 50 via a feed tube 64 to fill the well 53. Sufficient is added to flood over the chip 50 until the leading edge of the epoxy 62 impinges on the edge 56 of the UV irradiated area, where the intensity of the radiation is such that the uncured epoxy 62 is rapidly hardened creating a barrier 66 preventing further flow of the uncured epoxy 62 to the gate 58 of the chip 50. Uncured epoxy is added until the wires 60 etc. are covered and the level of uncured epoxy is sufficient for a satisfactory encapsulation layer to be produced. The whole structure is then flood illuminated to harden the epoxy as shown in FIG. 16, producing a solid encapsulation layer 68.

Figure 17:
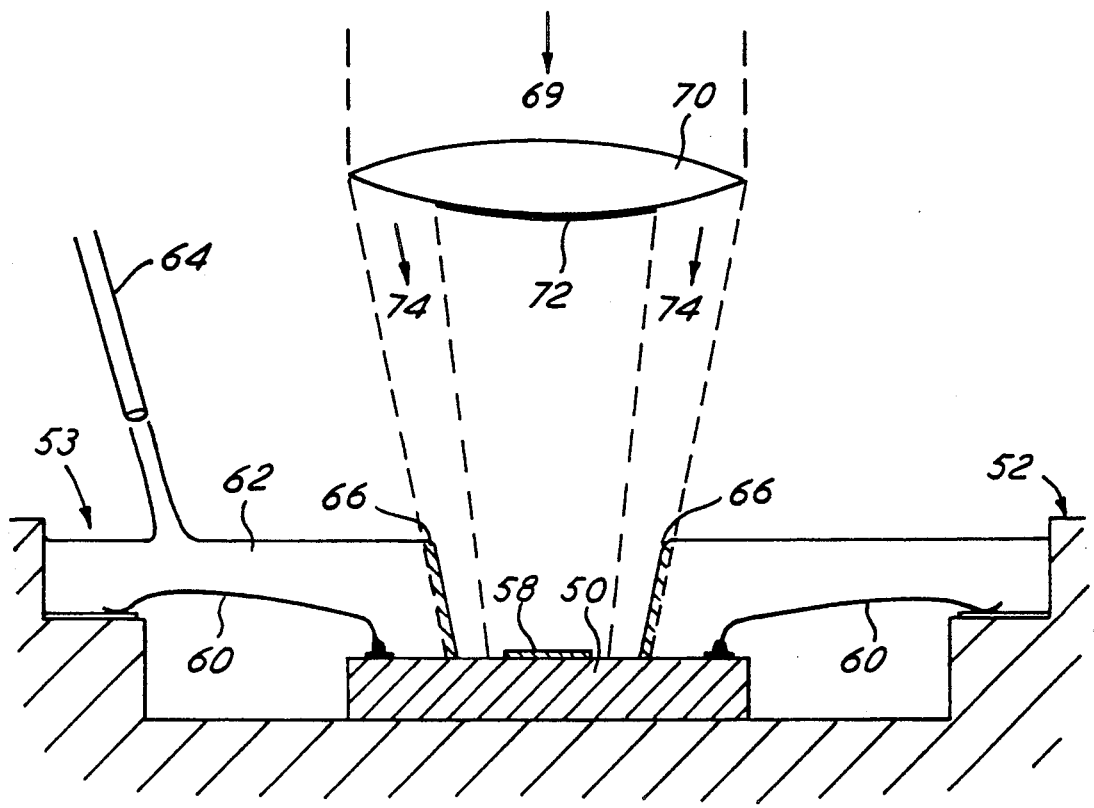
FIGS. 17 and 18 are sectional views showing variations on the method illustrated in FIGS. 14 to 16.
Figure 18:
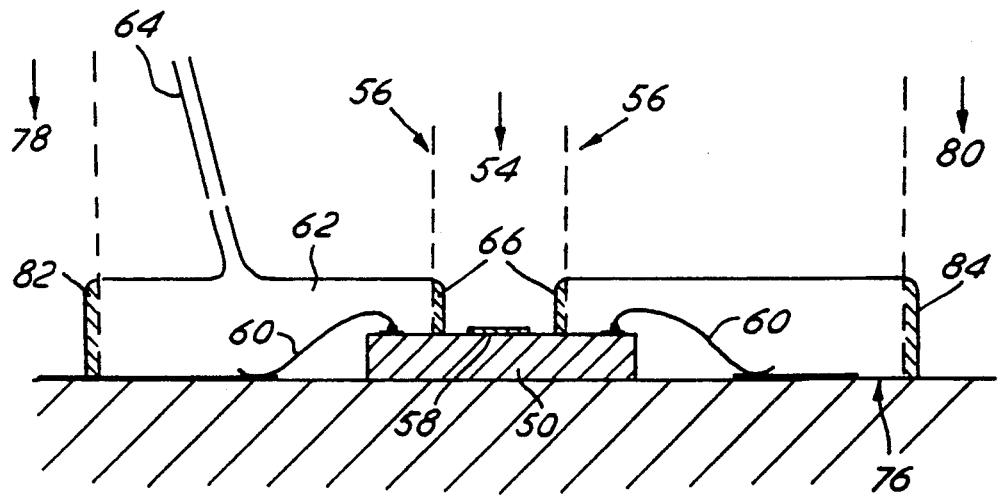

Modifications of this method for encapsulating ISFETs and related devices are shown in FIGS. 17 and 18.

In FIG. 17, a collimated beam of radiation 69 incident on a UV transparent lens 70 having a UV opaque area 72 produces a UV beam 74 of annular shape. The internal diameter of the annular beam is such that no radiation falls on the gate 58 of the chip 50. This prevents shifts in the threshold voltage of the chip 50 due to irradiation of the gate 58. Other optical systems may be used to produce similar effects, e.g. a suitable photomask may be positioned above a UV transparent lens, and the lens position adjusted to bring the photomask image into focus at the level at which the polymer is to be cured.

FIG. 18 shows a system in which the chip 50 is bonded onto a flat substrate 76. Beams of radiation 78, 80 are accordingly used to produce barriers 82, 84 to define the outer edges of the encapsulation layer.

A second example of the use of optical moulds in the formation of solid articles is in the formation of a system of one or more encapsulated ISFETs which incorporates a flow channel.

Figure 19:
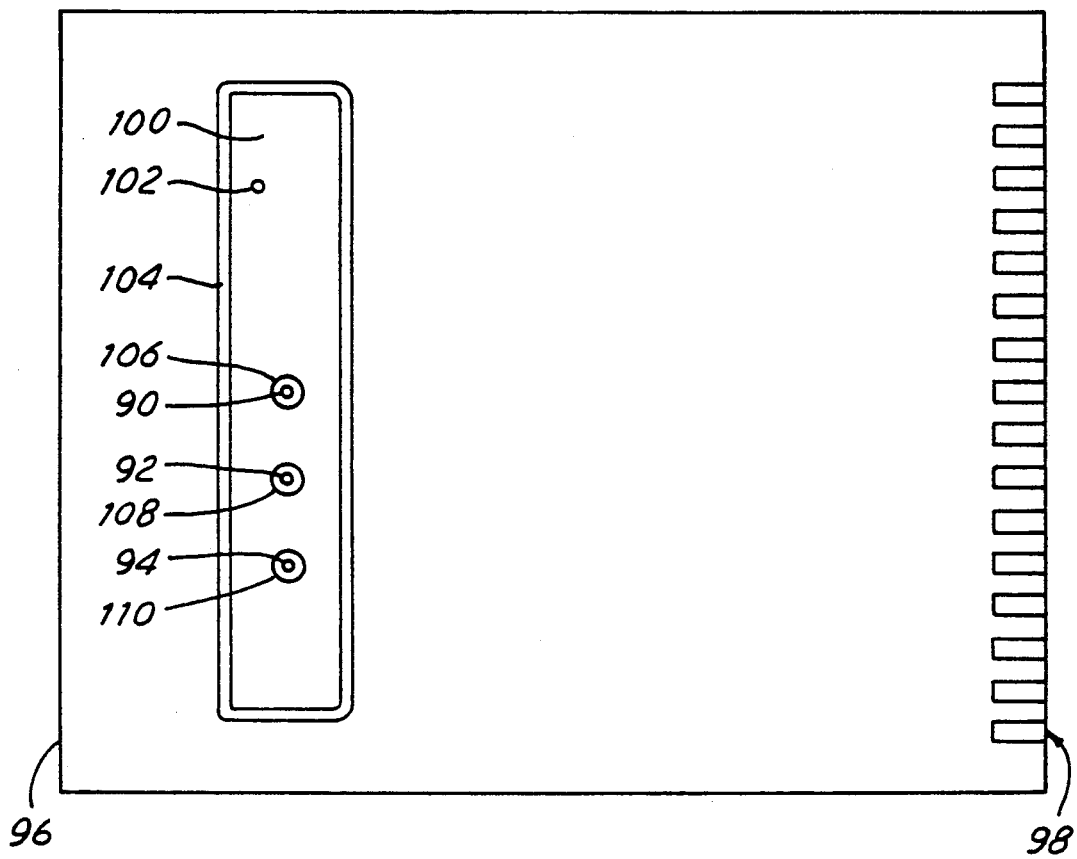
FIG. 19 is a plan view showing a stage in the simultaneous encapsulation of three microelectronic devices.

In the example illustrated in FIGS. 19, 20a and 20b, three ISFETs having gates 90, 92, 94 are mounted and bonded onto a substrate 96, e.g. a printed circuit board or screen printed ceramic, bearing a pattern of conductive tracks (not shown) leading to an edge connector 98. As shown in FIG. 19, the ISFETs are first encapsulated. Uncured epoxy 100 is fed onto the substrate 96 through an inlet 102. Optical moulds are used to produce the barrier 104 to limit the flow of uncured epoxy, and the barriers 106, 108 and 110 protecting the gates 90, 92, 94 of the ISFETs. When the level of uncured epoxy is sufficient for a satisfactory encapsulation layer to be produced, the whole structure is then flood illuminated to harden the epoxy to produce a solid encapsulation layer 112 (FIGS. 20a and 20b).

The other components of the flow system are then arranged on the substrate 96 as shown on FIGS. 20a and 20b. A reference electrode 114 is formed on the substrate 96 e.g. by chloridising an electroplated or printed silver area. A channel 116 between the reference electrode 114 and the position of the analyte flow channel 118 is formed using a suitable component such as a thin tube, ceramic frit, fibre bundle or a strip of gelled electrolyte, such as saturated potassium chloride with Agar. A tube 120 is provided to act as a connection between the reference electrode 114 and a reference electrode solution feed (not shown).

Tubes 122 and 124 are provided on the solid encapsulation layer 112 to act as connections from the analyte flow channel to be formed (position shown as 118) and sample and calibrant feeds (not shown). A UV transparent top cover 126 (not shown in FIG. 20a) is supported on spacers 128, 130 above the substrate 96. The separation of the top cover 126 and the solid encapsulation layer 112 sets the depth of the analyte flow channel 118 to be produced and is also such that the tubes 122 and 124 are trapped in position. The top cover 126 may be moulded to produce a satisfactory fit to the tubes 122 and 124. There is sufficient separation between the top cover 126 and the surface of the channel 116 to allow air and uncured epoxy to flow through.

The areas of the assembly to be kept free from epoxy—the analyte flow channel 118 and the reference electrode 114 are then illuminated with beams of radiation 132, 134 (as shown in FIG. 20b) acting as optical moulds. The assembly is then progressively filled with uncured epoxy from one side as indicated by the arrows 136, 138 in FIG. 20a. With adequate control of radiation intensity and epoxy flow rate, the volume between the substrate 96 and the top cover 125 fills with uncured epoxy, but with the illuminated areas 118 and 114 left clear except for the peripheral barrier of cured polymer. Once filling of the unexposed areas is complete, the whole assembly is flooded with radiation to complete the fabrication procedure.

Variations of the method for forming flow systems, as described, are possible. In particular, the channel between the reference electrode and the analyte flow channel may be formed by optical moulds rather than provided as a solid article. The reference electrode may use a gelled electrolyte laid down over the electrode and connecting to the analyte flow channel, in which case, the tube 120 may be omitted. The gelled electrolyte would be deposited before the top cover was placed in position and would protect the reference electrode from the uncured epoxy, so that illumination of the reference electrode would not be necessary during the epoxy filling stage.

The shape of the optical moulds may be controlled by various means including masking or suitable optical arrangements. The top cover may also be arranged, by provision for example of a suitable lens structure, to affect the distribution of illumination.

Device encapsulation and flow system construction may be realised by a single procedure, but with rather more complex epoxy flow and optical control.

It is envisaged that this method could be used to construct suitably dimensioned flow systems around flow sensors of various types e.g. microengineered beams as described for example in our European patent application No. 86309946.1, published under No. 0239703. Packages could also be constructed incorporating fluid logic pathways.

The general method described in this specification for forming solid articles from liquid substances which can be solidified by exposure to radiation may have other applications. In particular, the method may be used to form supports for micro engineered window frames for infra-red detectors.

While the specific embodiments described in this specification have related to Norland Optical Adhesive 81, a UV curable epoxy adhesive cured by UV radiation in the wavelength range from 320 nm to 400 nm, it will be understood that the present invention is applicable to any polymer curable by radiation of sufficient energy to produce cross-linkage in that polymer, and that the term 'radiation' as referred to in the invention is intended to embrace electromagnetic radiation in the IR to gamma wavelength ranges and particulate radiation such as alpha particles, such radiation being of the required energy for the polymer used.

We claim:

1. A method of forming a solid article of predetermined shape from a liquid which may be cured by exposure to radiation, the method comprising: providing a surface upon which the article is to be formed; exposing a region of the surface to radiation; supplying the liquid to an unexposed region of the surface such that said liquid disperses over the surface and on interfacing with said radiation cures to form a solid barrier around said region thereby to prevent the liquid from entering or contaminating said region; and curing the liquid which has been supplied but not yet cured to form the solid article.

2. A method according to claim 1 further comprising moving said radiation relative to said surface upon which the article is to be formed as liquid is being supplied to further define said surface of the article.

3. A method according to claim 1 wherein the method further comprises changing the shape of said radiation as liquid is being supplied to further define said surface of the article.

4. A method according to claim 1 further comprising altering the inclination and/or position of the surface upon which the article is to be formed relative to said radiation to further define said surface of the article.

5. A method according to claim 1 wherein the method further comprises the step of providing one or more sidewalls attached to the surface upon which the article is to be formed so as to define further surfaces of the articles.

6. A method according to claim 1 wherein the radiation is adapted to define more than one surface of the article.

7. A method according to claim 1 in which the solid article is to include a solid component of a different material, said solid component being positioned within said exposed region of the surface upon which the article is to be formed, wherein the different material is transparent to the radiation used.

8. A method according to any one of the preceding claims in which the liquid can be cured by exposure to heat wherein the step of curing the liquid which has been supplied but not yet cured comprises heating said liquid which has been supplied but not yet cured.

9. A method according to claim 1 in which the liquid can be cured by exposure to radiation of more than one wavelength, wherein the step of curing the liquid which has been supplied but not yet cured comprises exposing said liquid which has been supplied but not yet cured to a beam of more penetrating radiation.

10. A method according to claim 1 for encapsulating a microelectronic device wherein said surface on which the article is to be formed is a surface of said device and said article is an encapsulation of the device.

11. A method according to claim 1 in which the surface upon which the article to be formed includes a region which is not to be touched by the liquid, the method further comprising defining the shape of said radiation so that the borders of said region which is not to be touched by the liquid fall within said exposed region of the surface upon which the article is to be formed.

12. A method according to claim 11 for encapsulating a microelectronic device wherein said surface on which the article is to be formed is a surface of said device and said article is an encapsulation of the device.

13. A method of encapsulating a microelectronic device according to claim 12 wherein said region which is not to be touched by the liquid includes a responsive region of said device responsive to a particular external stimulus.

14. A method of encapsulating a microelectronic device according to claim 13 wherein said beam of radiation is so shaped that said responsive region of said device is not exposed to said beam.

15. A method of providing a microelectronic device, having a responsive region responsive to a particular external stimulus, with a flow channel suitable for exposing said responsive region to an analyte, wherein the walls of the flow channel are defined in accordance with the method of claim 11, in which said region which is not to be touched by the liquid is the cavity of the flow channel.

16. A method according to claim 15, wherein the method further comprises the step of encapsulating the microelectronic device wherein said surface on which the article is to be formed is a surface of said device and said article is an encapsulation of the device.

17. A method according to claim 15 wherein the method further comprises the step of providing a top solid layer of material transparent to the radiation above the microelectronic device so as to define the height of the flow channel. 18. A solid article formed from a liquid which can be cured by exposure to electromagnetic radiation by the method of claim 1.

18. A solid article formed from a liquid which can be cured by exposure to electromagnetic radiation by the method of claim 1.

* * * * *